(12) United States Patent
Camillo-Castillo et al.

(10) Patent No.: US 8,816,401 B2
(45) Date of Patent: Aug. 26, 2014

(54) HETEROJUNCTION BIPOLAR TRANSISTOR

(71) Applicant: International Business Machines Corporation, Armonk, NY (US)

(72) Inventors: Renata A. Camillo-Castillo, Essex Junction, VT (US); Jeffrey B. Johnson, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/689,838

(22) Filed: Nov. 30, 2012

(65) Prior Publication Data

US 2014/0151750 A1 Jun. 5, 2014

(51) Int. Cl.
*H01L 29/66* (2006.01)

(52) U.S. Cl.
USPC ........... 257/197; 257/565; 257/566; 257/567; 257/198; 257/616; 438/318

(58) Field of Classification Search
CPC ..................... H01L 29/7371; H01L 29/66318; H01L 29/66242; H01L 29/7378; H01L 29/1004
USPC .......................................... 257/197; 438/318
See application file for complete search history.

(56) References Cited

U.S. PATENT DOCUMENTS

| | | | |
|---|---|---|---|
| 5,106,767 A | 4/1992 | Comfort et al. | |
| 5,402,002 A | 3/1995 | Meister et al. | |
| 6,809,024 B1 * | 10/2004 | Dunn et al. | 438/623 |
| 6,888,221 B1 * | 5/2005 | Joseph et al. | 257/565 |
| 6,940,149 B1 | 9/2005 | Divakaruni et al. | |
| 6,967,144 B1 | 11/2005 | Sadovnikov | |
| 7,202,136 B2 | 4/2007 | Lanzerotti et al. | |
| 7,235,861 B1 | 6/2007 | Howard et al. | |
| 7,265,006 B2 | 9/2007 | Augusto et al. | |
| 2002/0117733 A1 * | 8/2002 | Racanelli | 257/591 |
| 2011/0198591 A1 | 8/2011 | Meunier-Beillard et al. | |
| 2011/0215417 A1 | 9/2011 | Meunier-Beillard et al. | |

OTHER PUBLICATIONS

Lanzerotti, et al., "Suppression of Boron Outdiffusion in SiGe HBTs by Carbon Incorporation," IEDM 96-249, IEEE 1996, pp. 10.2.1-10.2.4.

Donkers, et al., "A Novel Fully Self-Aligned SiGe:C HBT Architecture Featuring a Single-Step Epitaxial Collector-Base Process," IEEE 2007, pp. 655-658.

* cited by examiner

*Primary Examiner* — Lex Malsawma
*Assistant Examiner* — Long Le
(74) *Attorney, Agent, or Firm* — Gibb & Riley, LLC; Michael J. LeStrange, Esq.

(57) ABSTRACT

Structures and methods of making a heterojunction bipolar transistor (HBT) device that include: an n-type collector region disposed within a crystalline silicon layer; a p-type intrinsic base comprising a boron-doped silicon germanium crystal that is disposed on a top surface of an underlying crystalline Si layer, which is bounded by shallow trench isolators (STIs), and that forms angled facets on interfaces of the underlying crystalline Si layer with the shallow trench isolators (STIs); a Ge-rich, crystalline silicon germanium layer that is disposed on the angled facets and not on a top surface of the p-type intrinsic base; and an n-type crystalline emitter disposed on a top surface and not on the angled lateral facets of the p-type intrinsic base.

25 Claims, 6 Drawing Sheets

US 8,816,401 B2

HETEROJUNCTION BIPOLAR TRANSISTOR

BACKGROUND

1. Field of the Invention

The present disclosure generally relates to a structure and method of making a heterojunction bipolar transistor (HBT) that offers high-speed operation by reducing a collector-base capacitance. An exemplary embodiment of the HBT may include a p-type intrinsic base comprising a boron-doped, silicon germanium ($B^+$-doped $Si_{1-x1}Ge_{x1}$) epitaxial crystal that is disposed on a top surface of an underlying crystalline Si layer, which is bounded by shallow trench isolators (STIs), and that forms angled facets on interfaces of the underlying crystalline Si layer with the shallow trench isolators (STIs), and a germanium-rich crystalline $Si_{1-x2}Ge_{x2}$ layer epitaxial layer that is disposed on the angled facets. More particularly, a facet of the $B^+$-doped $Si_{1-x1}Ge_{x1}$ epitaxial crystal may affect boron out-diffusion from the epitaxial crystal. Yet more particularly, the germanium-rich crystalline $Si_{1-x2}Ge_{x2}$ epitaxial layer that "wraps around" the p-type intrinsic base of the $B^+$-doped $Si_{1-x1}Ge_{x1}$ epitaxial crystal may act as a barrier to boron diffusion along an interface region with the angled facets from an extrinsic base layer into the crystalline intrinsic region of the HBT.

2. Description of Related Art

A heterojunction bipolar transistor (HBT) includes, for example, a silicon/silicon germanium (Si/SiGe) heterojunction that provides superior conduction for operation at high frequencies. The Si/SiGe heterojunction of the HBT is formed by epitaxially growing a crystalline SiGe layer on a crystalline Si substrate. Since the crystalline Si substrate and crystalline SiGe layer are made of materials that are compatible with conventional photolithography processes, the HBT can be made at low cost with high yields. A $Si/Si_{1-x}Ge_x$ HBT also offers the ability to continuously adjust the bandgap of the heterojunction because Si and Ge are solid-soluble in each other to substantially any percentage.

FIG. 1 is a cross-sectional view illustrating an npn-type, $Si_{1-x}Ge_x$ HBT, 100. A collector region 105 is formed within an upper portion of a crystalline silicon substrate layer 102 that is centrally disposed between device-isolating shallow trench isolators 104. The crystalline silicon substrate layer 102 is grown epitaxially and an n-type impurity, such as phosphorus or arsenic (P, As), is introduced into an upper portion of the crystalline silicon substrate layer 102 during epitaxial growth or by subsequent ion implantation. The n-type impurity forms an n-type doped region within the silicon crystal that performs as an n-type crystalline collector region 105 for the HBT.

An undoped $Si_{1-x}Ge_x$ layer 120 is formed over the n-type crystalline collector region 105 by epitaxial growth of an admixture of a silicon-containing gas, such as silane ($SiH_4$), and a germanium-containing gas, such as germane ($GeH_4$). A p-type doped crystalline $p^+Si_{1-x}Ge_x$ layer 125 is epitaxially grown on the undoped $Si_{1-x}Ge_x$ layer 120, to form an intrinsic base of the HBT over the n-type crystalline collector region 105. Another gas, such as borane ($B_2H_6$), containing the p-type impurity, boron (B), is added to silicon-containing and germanium-containing gases, for epitaxial growth of the p-type doped crystalline $p^+Si_{1-x}Ge_x$ layer 125. The p-type doped crystalline $p^+Si_{1-x}Ge_x$ layer 125, which forms the intrinsic base of the HBT, is electrically connected to an extrinsic base layer 128 of the HBT.

An undoped crystalline silicon cap 130 is epitaxially grown over the intrinsic base of the p-type doped crystalline $p^+Si_{1-x}Ge_x$ layer 125. Together, the undoped crystalline silicon cap 130, and the p-type doped and undoped crystalline $Si_{1-x}Ge_x$ layers 125, 120, respectively, form a $Si/Si_{1-x}Ge_x$ heterojunction.

Referring to FIG. 1, an emitter opening is formed above a central portion of the undoped silicon cap 130, through the extrinsic base layer 128 and an insulating layer 140. The emitter opening may be lined with insulating sidewalls 137. An n-type doped non-crystalline polysilicon 135, which includes an n-type impurity, such as phosphorous or arsenic (P, As), is deposited using a silicon-containing gas and a phosphorus-containing or arsenic-containing gas within the emitter opening and over the undoped silicon cap 130. The structure is heated, which causes the phosphorus or arsenic (P, As) of the n-type doped non-crystalline polysilicon 135 to diffuse into the central portion of the undoped crystalline silicon cap 130, to form an n-type diffusion-doped crystalline emitter for the HBT. Subsequently, the n-type doped non-crystalline polysilicon 135 may be patterned, etched and thermally annealed to form an emitter lead electrode 135.

It should be noted that the emitter/base/collector junctions of the HBT of FIG. 1 are partitioned from one another, not by the boundaries of the Si/SiGe crystals, but by the concentration profiles of the doping impurities.

There remains a need to improve high-speed operation of heterojunction bipolar transistors (HBTs).

SUMMARY

In view of the foregoing, an exemplary embodiment of the disclose may provide a heterojunction bipolar transistor (HBT) device that includes an n-type doped silicon (Si) collector region disposed within a crystalline Si substrate layer that is bounded by shallow trench isolators (STIs). The HBT may also include a p-type intrinsic base comprising a boron-doped silicon germanium ($B^+$-doped $Si_{1-x1}Ge_{x1}$) crystal that is disposed on a top surface of the crystalline Si substrate layer and that forms angled facets on interfaces of the crystalline Si substrate layer with the STIs. The HBT may further include a Ge-rich, crystalline $Si_{1-x2}Ge_{x2}$ layer disposed on the angled facets and not on a top surface of the $B^+$-doped $Si_{1-x1}Ge_{x1}$ crystal. Finally, the HBT may include an n-type diffusion-doped Si crystalline emitter disposed on the top surface and not on the angled facets of the $B^+$-doped $Si_{1-x1}Ge_{x1}$ crystal.

Another exemplary embodiment may provide a heterojunction bipolar transistor (HBT) device that includes an n-type collector region disposed within a crystalline silicon (Si) layer that is bounded by shallow trench isolators (STIs). The HBT may also include a p-type intrinsic base comprising a boron-doped carbon-containing silicon germanium ($B^+$-doped $Si_{1-x1-y}Ge_{x1}C_y$) crystal that is disposed on a top surface of the crystalline Si layer and that forms angled facets on interfaces of the crystalline Si layer with the STIs. The HBT may further include a Ge-rich, crystalline $Si_{1-x2}Ge_{x2}$ layer disposed on the angled facets and not on a top surface of the $B^+$-doped $Si_{1-x1-y}Ge_{x1}C_y$ crystal. Finally, the HBT may include an n-type diffusion-doped Si crystalline emitter disposed on the top surface and not on the angled facets of the $B^+$-doped $Si_{1-x1-y}Ge_{x1}C_y$ crystal.

Yet another exemplary embodiment may provide a method of making a heterojunction bipolar transistor (HBT) device that includes forming an n-type collector region within a crystalline silicon (Si) layer that is bounded by shallow trench isolators (STIs). The method may also include epitaxially growing a p-type intrinsic base that comprises a boron-doped silicon germanium ($B^+$-doped $Si_{1-x1}Ge_{x1}$) crystal on a top surface of the crystalline Si layer, where the $B^+$-doped $Si_{1-x1}Ge_{x1}$ crystal forms angled facets on interfaces of the crystalline Si layer with the STIs. The method may further include depositing a sacrificial layer on a top surface and not on the angled facets of the $B^+$-doped $Si_{1-x1}Ge_{x1}$ crystal. The method may yet further include epitaxially growing a Ge-rich crystalline $Si_{1-x2}Ge_{x2}$ layer on the sacrificial layer and on the angled facets of the $B^+$-doped $Si_{1-x1}Ge_{x1}$ crystal. The method may yet further include epitaxially growing a p-type extrinsic base layer comprising a highly $B^+$-doped crystalline Si layer on the Ge-rich crystalline $Si_{1-x2}Ge_{x2}$ layer. The method may yet further include etching an emitter opening through a central portion of at least the highly $B^+$-doped crystalline Si layer, the Ge-rich crystalline $Si_{1-x2}Ge_{x2}$ layer, and the sacrificial layer to the top surface of the $B^+$-doped $Si_{1-x1}Ge_{x1}$ crystal. Finally, the method may include forming an n-type diffusion-doped Si crystalline emitter on the top surface of the $B^+$-doped $Si_{1-x1}Ge_{x1}$ crystal in the emitter opening.

Yet another exemplary embodiment may provide a method of making a heterojunction bipolar transistor (HBT) device that includes forming an n-type collector region within a crystalline silicon (Si) layer that is bounded by shallow trench isolators (STIs). The method may also include epitaxially growing a p-type intrinsic base that comprises a boron-doped silicon germanium ($B^+$-doped $Si_{1-x1}Ge_{x1}$) crystal on a top surface of the crystalline Si layer, where the $B^+$-doped $Si_{1-x1}Ge_{x1}$ crystal forms angled facets that are disposed on interfaces of the crystalline Si layer with the STIs. The method may further include depositing a sacrificial layer on a top surface and not on the angled facets of the $B^+$-doped $Si_{1-x1}Ge_{x1}$ crystal. The method may yet further include epitaxially growing a Ge-rich crystalline $Si_{1-x2}Ge_{x2}$ layer on the sacrificial layer and on the angled facets of the $B^+$-doped $Si_{1-x1}Ge_{x1}$ crystal. The method may yet further include epitaxially growing a p-type extrinsic base layer comprising a highly $B^+$-doped crystalline Si layer on the Ge-rich crystalline $Si_{1-x2}Ge_{x2}$ layer. The method may yet further include forming an insulating layer on the highly $B^+$-doped crystalline Si layer. The method may yet further include etching an emitter opening through a central portion of the insulating layer, the highly $B^+$-doped crystalline Si layer, the Ge-rich crystalline $Si_{1-x2}Ge_{x2}$ layer, and the sacrificial layer to the top surface of the $B^+$-doped $Si_{1-x1}Ge_{x1}$ crystal. The method may yet further include epitaxially growing a crystalline Si cap on the top surface of the $B^+$-doped $Si_{1-x1}Ge_{x1}$ crystal. The method may yet further include forming an n-type doped non-crystalline polysilicon on the crystalline Si cap. Finally, the method may include annealing the n-type doped non-crystalline polysilicon to form an n-type doped crystalline emitter, from which an n-type impurity diffuses into the crystalline Si cap to form an n-type diffusion-doped Si crystalline emitter of the HBT.

BRIEF DESCRIPTION OF THE DRAWINGS

The exemplary embodiments of the disclosure will be better understood from the following detailed description with reference to the drawings, which are not necessarily drawn to scale and in which.

DETAILED DESCRIPTION

Figure 1:
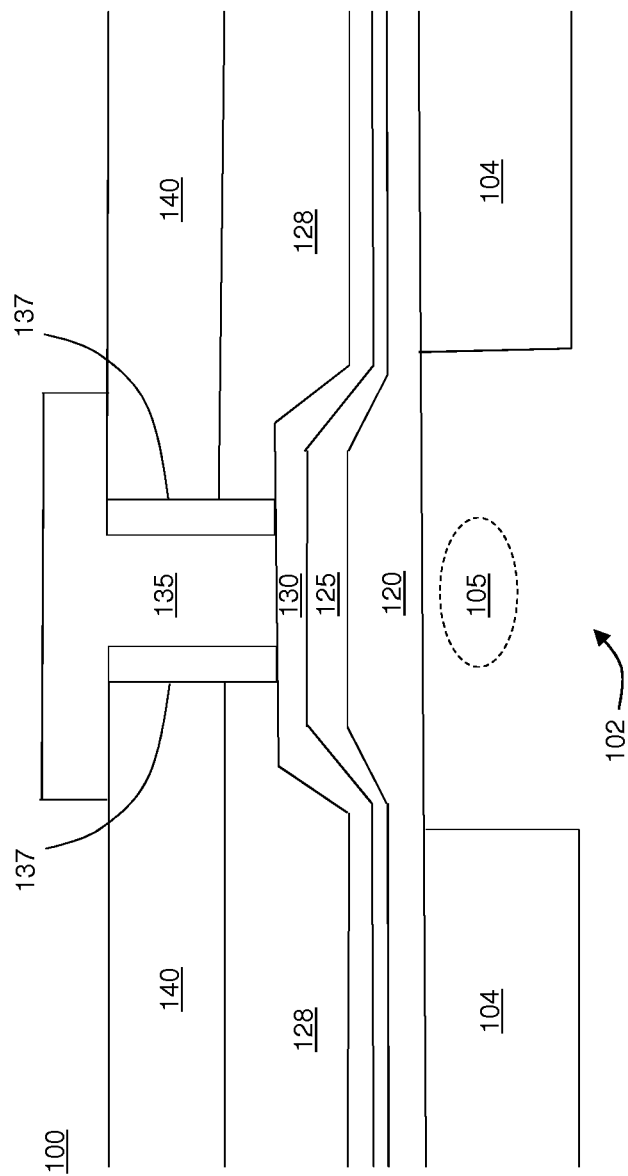
FIG. 1 is a schematic diagram illustrating a cross-section of a heterojunction bipolar transistor (HBT) in the related art.

The exemplary embodiments of the disclosure and their various features and advantageous details are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments of the disclosure. The examples are intended to merely facilitate an understanding of ways in which the exemplary embodiments of the disclosure may be practiced and to further enable those of skill in the art to practice the exemplary embodiments. Accordingly, the examples should not be construed as limiting the scope of the exemplary embodiments of the disclosure.

As described above, there remains a need to improve high-speed operation of heterojunction bipolar transistors (HBTs). One factor that may improve high-speed operation is to reduce the capacitance between the collector and base junctions of the HBT.

In an embodiment of the disclosure, an HBT may include a germanium-rich $Si_{1-x2}Ge_{x2}$ epitaxial layer that "wraps around" a boron-doped, silicon germanium ($B^+$-doped $Si_{1-x1}Ge_{x1}$) crystalline intrinsic base and acts as a barrier to boron diffusion along an interface region with the angled facets from an extrinsic base layer into the crystalline intrinsic region of the HBT.

Figure 2:
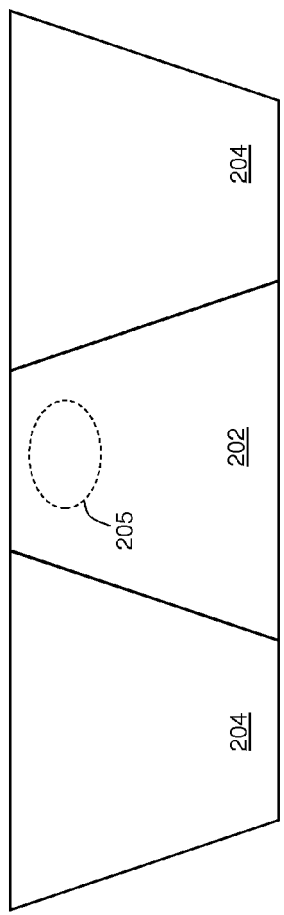
FIG. 2 is a schematic diagram illustrating a cross-section of an n-type collector region disposed within a crystalline silicon (Si) layer bounded by shallow trench isolators (STIs) that may be used in making an HBT in an exemplary embodiment.

Referring to FIG. 2, a collector region 205 may be disposed within an upper portion of a crystalline Si substrate layer 202 between device-isolating shallow trench isolators 204. A top surface of the crystalline Si substrate layer 202 and top surfaces of the shallow trench isolators 204 may be co-planar. The crystalline Si substrate layer 202 may be grown epitaxially at a low temperature of less than 600° C. and an n-type impurity, for example, one of phosphorous (P) and arsenic (As), may be introduced into the upper portion of the crystalline Si substrate layer during epitaxial growth or by subsequent ion implantation to form n-type doped Si collector region 205 of the HBT.

Figure 3:
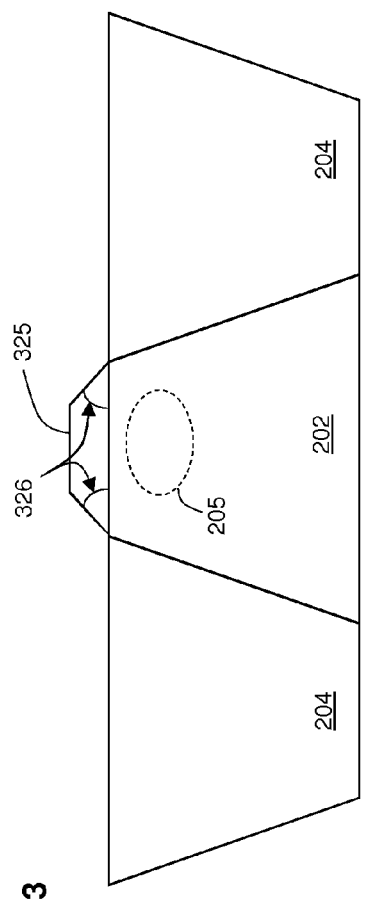
FIG. 3 is a schematic diagram illustrating a cross-section of a crystalline p-type intrinsic base comprising a boron-doped silicon germanium ($B^+$-doped $Si_{1-x1}Ge_{x1}$) crystal that may be used in making the HBT in an exemplary embodiment.

Referring to FIG. 3, a p-type crystalline intrinsic base of the HBT may comprise a boron-doped silicon germanium ($B^+$-doped $Si_{1-x1}Ge_{x1}$) crystal 325 in an exemplary embodiment. The $B^+$-doped $Si_{1-x1}Ge_{x1}$ crystal 325 may be disposed on a top surface of the crystalline Si substrate layer 202 and may form angled facets disposed on interfaces of the crystalline Si substrate layer 202 with the shallow trench isolators 204. The mole fraction, x1, of germanium in the $B^+$-doped $Si_{1-x1}Ge_{x1}$ crystal 325 may range from 10% to 40%, and may preferably comprise 40%. Alternatively, the $B^+$-doped $Si_{1-x1}Ge_{x1}$ crystal 325 may also contain carbon (C), which is known to inhibit boron out-diffusion. In this case, the carbon mole fraction, y, in a $B^+$-doped $Si_{1-x1-y}Ge_{x1}C_y$ crystal may range from 0.01% to 0.10%, and may preferably comprise 0.05%.

The $B^+$-doped $Si_{1-x1}Ge_{x1}$ crystal 325 may be formed on the crystalline Si substrate layer 202 by epitaxial growth of an admixture of: a silicon-containing gas, for example, one of silane ($SiH_4$) and disilane ($Si_2H_6$); a germanium-containing gas, for example, one of germane ($GeH_4$) and digermane ($Ge_2H_6$); and a boron-containing gas, for example, borane ($B_2H_6$). Alternatively, a carbon-containing gas, for example, methylsilane ($CH_3SiH_3$), may be added to the admixture of silicon-containing, germanium-containing, and boron-containing gases to form the $B^+$-doped $Si_{1-x1-y}Ge_{x1}C_y$ crystal.

The epitaxial growth temperature of the $B^+$-doped $Si_{1-x1}Ge_{x1}$ crystal of the p-type intrinsic base 325 may affect the facets and the facet angles 326 of the crystal 325. Angled facets, epitaxially grown at a low temperature, may demonstrate out-diffusion of boron alongside the interface regions of the STIs 204 and the crystalline Si substrate layer 202, following higher temperature processes used to complete the making of the HBT. This out-diffusion of boron may increase collector-base capacitance. However, epitaxial growth at higher temperatures may demonstrate a reduced out-diffusion of boron from the angled facets of the $B^+$-doped $Si_{1-x1}Ge_{x1}$ crystal 325 and thus, maintain a reduced collector-base capacitance.

Other epitaxial growth conditions that affect the facets and facet angles 326 of the $B^+$-doped $Si_{1-x1}Ge_{x1}$ crystalline intrinsic base 325 may include the presence of oxide or nitride materials at the interface of the crystal 325 with the STIs 204, the orientation of crystalline planes of the underlying crystalline Si substrate layer 202, and the rate of gas flows for deposition of the crystalline intrinsic base 325.

Figure 4:
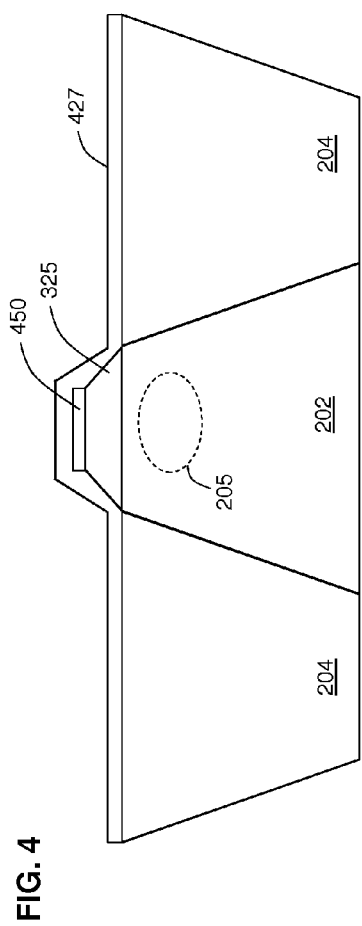
FIG. 4 is a schematic diagram illustrating a cross-section of a sacrificial layer formed on a top surface of the crystalline p-type intrinsic base and a Ge-rich crystalline $Si_{1-x2}Ge_{x2}$ layer formed over the sacrificial layer and angled facets of the crystalline p-type intrinsic base that may be used in making the HBT in an exemplary embodiment.

Referring to FIG. 4, a sacrificial layer 450 comprising one of an oxide and a photomask material may be disposed on a top surface and not on the angled facets of the $B^+$-doped $Si_{1-x1}Ge_{x1}$ crystalline intrinsic base 325. Subsequently, a Ge-rich crystalline $Si_{1-x2}Ge_{x2}$ layer 427 may be disposed on the sacrificial layer 450 and on the angled facets of the $B^+$-doped crystalline intrinsic base 325 in an exemplary embodiment. The rich concentration of germanium in the lattice of the crystalline $Si_{1-x2}Ge_{x2}$ layer 427 may provide a diffusion block to boron from the $B^+$-doped faceted crystalline intrinsic base 325.

Ideally, the mole fraction, x2, of the Ge-rich crystalline $Si_{1-x2}Ge_{x2}$ layer 427 may be approximately equal to that of the mole fraction, x1, of the $B^+$-doped $Si_{1-x1}Ge_{x1}$ faceted crystalline intrinsic base 325, to block boron out-diffusion from the crystalline intrinsic base 325. To block boron out-diffusion from the faceted crystalline intrinsic base 325 the mole fraction, x2, of the Ge-rich crystalline $Si_{1-x2}Ge_{x2}$ layer 427 may also be greater than that of the mole fraction, x1, of the $B^+$-doped $Si_{1-x1}Ge_{x1}$ faceted crystalline intrinsic base 325. For example, the mole fraction, x2, of the Ge-rich crystalline $Si_{1-x2}Ge_{x2}$ layer 427 may be 20%, while the mole fraction, x1, of the $B^+$-doped $Si_{1-x1}Ge_{x1}$ faceted crystalline intrinsic base 325 is 10%. In various exemplary embodiments, the mole fraction, x2, of the Ge-rich crystalline $Si_{1-x2}Ge_{x2}$ layer 427 may range from 15% to 40%. Blocking out-diffusion of boron from the $B^+$-doped faceted crystalline intrinsic base 325 by the "wrap-around" Ge-rich crystalline $Si_{1-x2}Ge_{x2}$ layer 427 may maintain a reduced collector-base capacitance, following higher temperature processes used to complete the making of the HBT.

Alternatively, the Ge-rich crystalline $Si_{1-x2}Ge_{x2}$ layer 427 may also contain carbon (C), where the mole fraction, y, of carbon in a Ge-rich crystalline $Si_{1-x2-y}Ge_{x2}C_y$ layer 427 may range up to 0.20%.

The Ge-rich crystalline $Si_{1-x2}Ge_{x2}$ layer 427 may be formed on the sacrificial layer 450 and the $B^+$-doped crystalline intrinsic base 325 by epitaxial growth at a low temperature by an admixture of: a silicon-containing gas, for example, one of silane ($SiH_4$) and disilane ($Si_2H_6$); and a germanium-containing gas, for example, one of germane ($GeH_4$) and digermane ($Ge_2H_6$). Alternatively, a small amount of carbon may be added to the Ge-rich crystalline $Si_{1-x2}Ge_{x2}$ layer 427 by further adding a carbon-containing gas, for example, methyl silane ($CH_3SiH_3$) to the silicon-containing gas and the germanium-containing gas to form the Ge-rich crystalline $Si_{1-x2-y}Ge_{x2}C_y$ layer 427.

Figure 5:
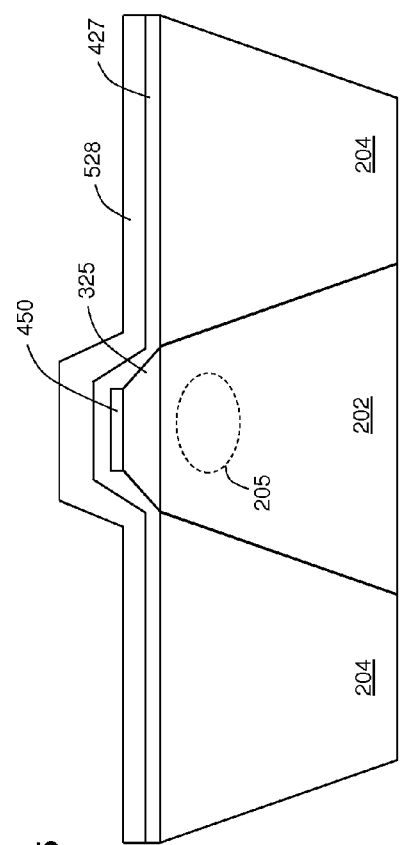
FIG. 5 is a schematic diagram illustrating a cross-section of a p-type extrinsic base layer formed on the Ge-rich crystalline $Si_{1-x2}Ge_{x2}$ layer that may be used in making the HBT in an exemplary embodiment.

Referring to FIG. 5, an extrinsic base layer 528 comprising a highly $B^+$-doped silicon layer may be disposed on the Ge-rich crystalline $Si_{1-x2}Ge_{x2}$ layer 427. Deposition temperatures for the highly $B^+$-doped extrinsic base layer 528 may be similar those used for the Ge-rich crystalline $Si_{1-x2}Ge_{x2}$ layer 427. The highly $B^+$-doped silicon layer of the extrinsic base may comprise one of polysilicon and crystalline silicon. In the case of polysilicon, the deposition of the highly $B^+$-doped polysilicon layer 528 may be subsequently annealed to produce a crystalline highly $B^+$-doped silicon layer. Alternatively, the highly $B^+$-doped extrinsic base layer 528 may also include germanium, where the mole fraction of germanium may range up to 40%.

The highly $B^+$-doped extrinsic base layer 528 may be deposited on the Ge-rich crystalline $Si_{1-x2}Ge_{x2}$ layer 427 by an admixture of: a silicon-containing gas, for example, one of silane ($SiH_4$) and disilane ($Si_2H_6$), and a boron-containing gas, for example, borane ($B_2H_6$). Alternatively, a germanium-containing gas, for example, one of germane ($GeH_4$) and digermane ($Ge_2H_6$), may be added to the admixture of the silicon-containing gas and the boron-containing gas to form the highly $B^+$-doped extrinsic base layer 528 of the HBT.

Figure 6:
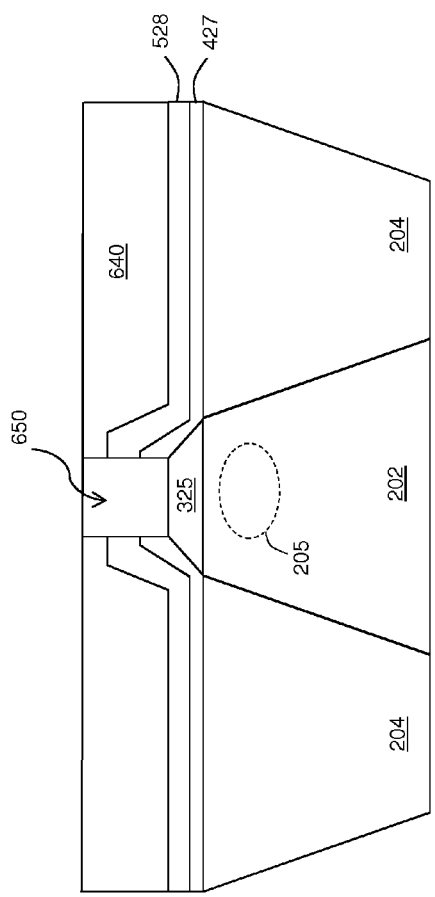
FIG. 6 is a schematic diagram illustrating a cross-section of an insulating layer, formed on the p-type extrinsic base layer, through which an emitter opening is etched to the top surface of the crystalline p-type intrinsic base that may be used in making the HBT in an exemplary embodiment.

Referring to FIG. 6, an insulating layer 640 comprising, for example, a silicon oxide, may be disposed on the highly $B^+$-doped extrinsic base layer 528. An emitter stack opening 650 may be etched to penetrate the insulating layer 640, the highly $B^+$-doped extrinsic base layer 528, the Ge-rich crystalline $Si_{1-x2}Ge_{x2}$ layer 427 and the sacrificial layer 450, to an upper surface of the $B^+$-doped $Si_{1-x1}Ge_{x1}$ faceted crystalline intrinsic base 325.

Figure 7:
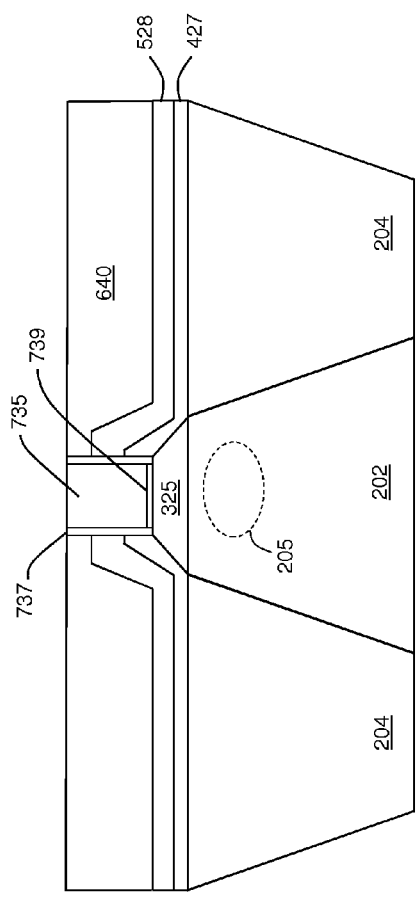
FIG. 7 is a schematic diagram illustrating a cross-section of insulating sidewalls and an n-type diffusion doped crystalline emitter formed within the emitter opening that may be used in making the HBT in an exemplary embodiment.

Referring to FIG. 7, insulating sidewalls 737 may be formed on the sides of the emitter stack opening 650 and may comprise any of an oxide and a nitride. A crystalline silicon (Si) cap 739 may be deposited on the upper surface of the $B^+$-doped $Si_{1-x1}Ge_{x1}$ faceted crystalline intrinsic base 325 and between the insulating sidewalls 737. The insulating sidewalls 737 may permit a highly doped n-type emitter stack 735 to be formed on the crystalline Si cap 739. The crystalline Si cap 739 may be epitaxially grown at a low temperature on the upper surface of the $B^+$-doped $Si_{1-x1}Ge_{x1}$ faceted crystalline intrinsic base 325 by the admixture of a silicon-containing gas, for example, one of silane ($SiH_4$) and disilane ($Si_2H_6$).

An n-type doped non-crystalline polysilicon, which includes an n-type impurity, for example, one of phosphorus (P) and arsenic (As), may be deposited using a silicon-containing gas and one of a phosphorus-containing gas and an arsenic-containing gas within the emitter stack opening 640 and over the crystalline Si cap 739. Upon subsequent heating to thermally anneal the n-type doped non-crystalline polysilicon, the n-type impurity may diffuse from the overlying n-type doped non-crystalline polysilicon into the crystalline Si cap 739, to form an n-type diffusion-doped crystalline emitter 739 of the HBT. The thermally annealed n-type doped non-crystalline polysilicon overlying the n-type diffusion-doped crystalline emitter 739 may now form an n-type doped crystalline emitter stack 735.

Figure 8:
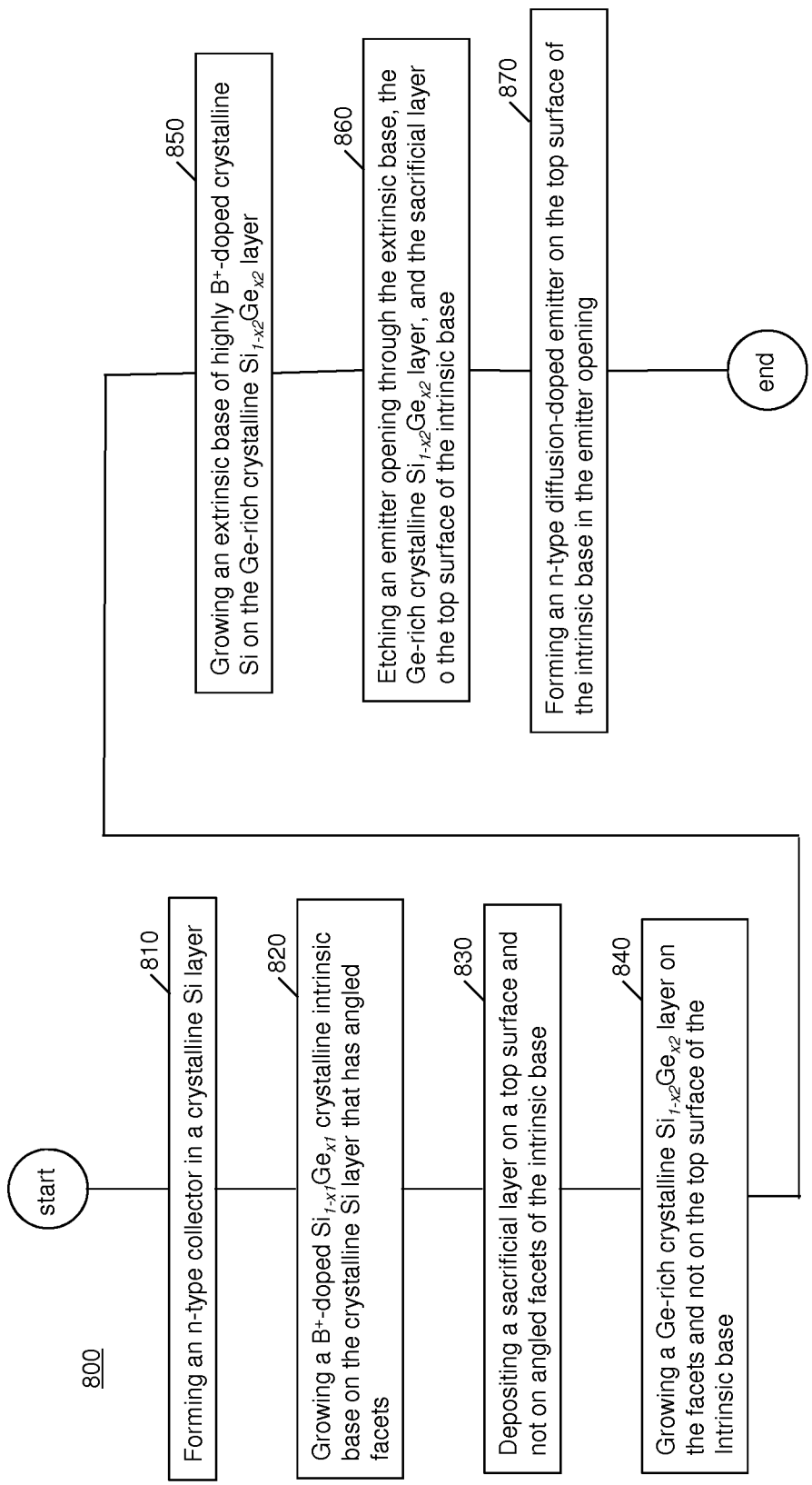
FIG. 8 is a flow chart 800 illustrating a method of making a heterojunction bipolar transistor (HBT) in an exemplary embodiment of the disclosure.

Referring to FIG. 8, flowchart 800 may illustrate an exemplary embodiment of a method of making a heterojunction bipolar transistor (HBT). The method may include forming an n-type doped silicon (Si) collector region within a crystalline Si substrate layer that is bounded by shallow trench isolators (STIs) 810. The method may also include epitaxially growing a p-type intrinsic base that comprises a boron-doped silicon germanium ($B^+$-doped $Si_{1-x1}Ge_{x1}$) crystal on a top surface of the Si crystalline layer, where the $B^+$-doped $Si_{1-x1}Ge_{x1}$ crystal forms angled facets on interfaces of the crystalline Si layer with the STIs, 820. The epitaxially growing of the p-type intrinsic base may further include adding a carbon-containing gas to an admixture of boron-containing, silicon-containing, and germanium-containing gases to epitaxially grow a $B^+$-doped $Si_{1-x1-y}Ge_{x1}C_y$ crystal. The method may further include depositing a sacrificial layer on a top surface and not on the angled facets of the $B^+$-doped $Si_{1-x1}Ge_{x1}$ crystal, 830. The method may yet further include epitaxially growing a Ge-rich crystalline silicon germanium ($Si_{1-x2}Ge_{x2}$) layer on the sacrificial layer and on the angled facets of the $B^+$-doped $Si_{1-x1}Ge_{x1}$ crystal, 840. The method may yet further include epitaxially growing a p-type extrinsic base layer comprising a highly $B^+$-doped crystalline Si layer on the Ge-rich crystalline $Si_{1-x2}Ge_{x2}$ layer, 850. The method may yet further include etching an emitter opening through a central portion of at least the highly $B^+$-doped crystalline Si layer, the Ge-rich crystalline $Si_{1-x2}Ge_{x2}$ layer, and the sacrificial layer to the top surface of the $B^+$-doped $Si_{1-x1}Ge_{x1}$ crystal, 860. The method may further include forming an insulating layer on the highly $B^+$-doped crystalline Si layer, before etching the emitter opening. Finally, the method may include forming an n-type diffusion-doped Si crystalline emitter on the top surface of the $B^+$-doped $Si_{1-x1}Ge_{x1}$ crystal in the emitter opening, 870. The forming of an n-type diffusion-doped Si crystalline emitter on the top surface of the $B^+$-doped $Si_{1-x1}Ge_{x1}$ crystal in the emitter opening may further include: forming insulating sidewalls on the emitter opening; epitaxially growing a crystalline Si cap on the top surface of the $B^+$-doped $Si_{1-x1}Ge_{x1}$ crystal between the insulating sidewalls; forming an n-type doped non-crystalline polysilicon on the crystalline Si cap between the insulating sidewalls; and annealing the n-type doped non-crystalline polysilicon to form an n-type doped emitter lead, from which an n-type impurity diffuses into the crystalline Si cap to form the n-type diffusion-doped crystalline emitter of the HBT.

Figure 9:
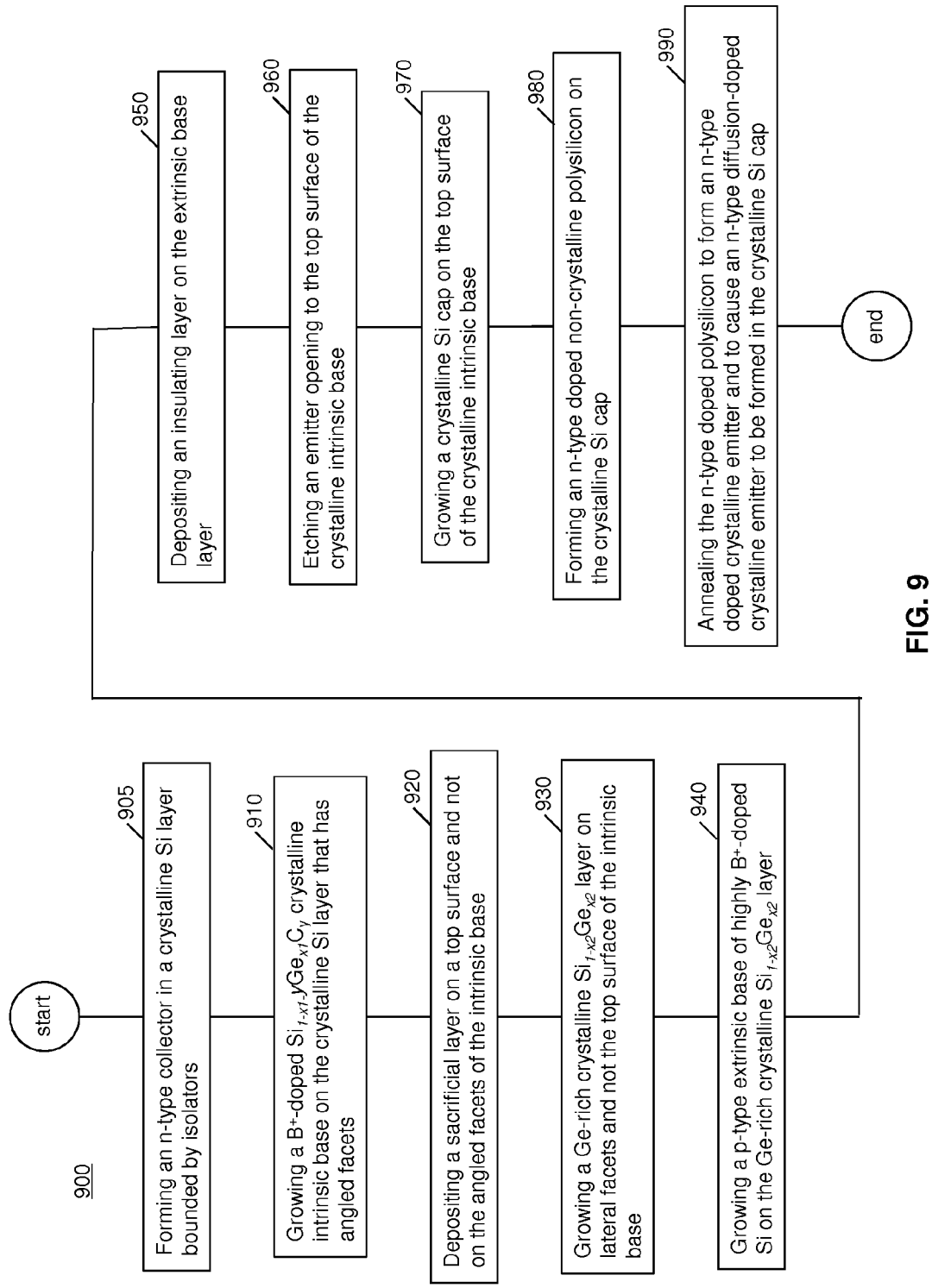
FIG. 9 is a flow chart 900 illustrating a method of making a heterojunction bipolar transistor (HBT) in another exemplary embodiment of the disclosure.

Referring to FIG. 9, flowchart 900 may illustrate an exemplary embodiment of a method of making a heterojunction bipolar transistor (HBT). The method may include forming an n-type collector region within a crystalline silicon (Si) layer that is bounded by shallow trench isolators (STIs), 905. The method may also include epitaxially growing a p-type intrinsic base that comprises a boron-doped silicon germanium ($B^+$-doped $Si_{1-x1}Ge_{x1}$) crystal on a top surface of the crystalline Si layer, where the $B^+$-doped $Si_{1-x1}Ge_{x1}$ crystal forms angled facets that are disposed on interfaces of the crystalline Si layer with the STIs, 910. The epitaxially growing of the $B^+$-doped carbon-containing $Si_{1-x1-y}Ge_{x1}C_y$ crystal may include an admixture of: one of silane ($SiH_4$) and disilane ($Si_2H_6$) gases, one of germane ($GeH_4$) and digermane ($Ge_2H_6$) gases, borane ($B_2H_6$) gas, and methylsilane ($CH_3SiH_3$) gas. A Ge mole fraction, x1, of the $B^+$-doped carbon-containing $Si_{1-x1-y}Ge_{x1}C_y$ crystal may range from 10% to 40%, and a carbon mole fraction, y, of the $B^+$-doped carbon-containing $Si_{1-x1}Ge_{x1}C_y$ crystal may range from 3% to 10%. The method may further include depositing a sacrificial layer on a top surface and not on the angled facets of the $B^+$-doped $Si_{1-x1}Ge_{x1}$ crystal, 920. The method may yet further include epitaxially growing a Ge-rich crystalline $Si_{1-x2}Ge_{x2}$ layer on the sacrificial layer and on the angled facets of the $B^+$-doped $Si_{1-x1}Ge_{x1}$ crystal, 930. The epitaxially growing of the Ge-rich, $Si_{1-x2}Ge_{x2}$ layer may include an admixture of: one of silane ($SiH_4$) and disilane ($Si_2H_6$) gases, and one of germane ($GeH_4$) and digermane ($Ge_2H_6$) gases. A Ge mole fraction, x2, of the Ge-rich, crystalline $Si_{1-x2}Ge_{x2}$ layer may be greater than or equal to a Ge mole fraction, x1, of the $B^+$-doped carbon-containing $Si_{1-x1-y}Ge_{x1}C_y$ crystal of the p-type intrinsic base. The method may yet further include epitaxially growing a p-type extrinsic base layer comprising a highly $B^+$-doped crystalline Si layer on the Ge-rich crystalline $Si_{1-x2}Ge_{x2}$ layer, 940. The epitaxially growing of the p-type extrinsic base layer may further include adding one of germane ($GeH_4$) and digermane ($Ge_2H_6$) gases to an admixture of one of silane ($SiH_4$) and disilane ($Si_2H_6$) gases and borane gas, to form a highly $B^+$-doped crystalline $Si_{1-x3}Ge_{x3}$ layer, where a Ge mole fraction, x3, of the highly $B^+$-doped crystalline $Si_{1-x3}Ge_{x3}$ layer may range up to 10%. The method may yet further include forming an insulating layer on a highly $B^+$-doped crystalline Si layer, 950. The method may yet further include etching an emitter opening through a central portion of the insulating layer, the highly $B^+$-doped crystalline Si layer, the Ge-rich crystalline $Si_{1-x2}Ge_{x2}$ layer, and the sacrificial layer to the top surface of the $B^+$-doped $Si_{1-x1}Ge_{x1}$ crystal, 960. The method may yet further include epitaxially growing a crystalline Si cap on the top surface of the $B^+$-doped $Si_{1-x1}Ge_{x1}$ crystal, 970. The method may further include forming insulating sidewalls on the emitter opening, before epitaxially growing the crystalline Si cap. The method may yet further include forming an n-type doped non-crystalline polysilicon on the crystalline Si cap, 980. Finally, the method may include annealing the n-type doped non-crystalline polysilicon to form an n-type doped crystalline emitter, from which an n-type impurity diffuses into the crystalline Si cap to form an n-type diffusion-doped Si crystalline emitter of the HBT, 990.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

A hardmask can be formed of any suitable material, whether now known or developed in the future, such as a metal or organic hardmask, that has a hardness greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

What is claimed is:

1. A heterojunction bipolar transistor (HBT) device, comprising:
    an n-type collector region disposed within a crystalline substrate layer that is bounded by shallow trench isolators (STIs);
    a p-type intrinsic base comprising a silicon germanium (SiGe) crystal that is disposed on a top surface of said crystalline substrate layer and that forms angled facets on interfaces of said crystalline substrate layer with said STIs;
    a Ge-rich SiGe crystalline layer disposed on said angled facets and not on a top surface of said SiGe crystal; and a n-type diffusion-doped crystalline emitter disposed on said top surface and not on said angled facets of said SiGe crystal.

2. The HBT device of claim 1, said p-type intrinsic base comprising a boron-doped silicon germanium (B$^+$-doped $Si_{1-x1}Ge_{x1}$) crystal, a Ge mole fraction, x1, of said B$^+$-doped $Si_{1-x1}Ge_{x1}$ crystal ranging from 10% to 40%.

3. The HBT device of claim 2, said p-type intrinsic base further comprising carbon (C) to form a B$^+$-doped $Si_{1-x1-y}Ge_{x1}C_y$ crystal, a carbon mole fraction, y, of said B$^+$-doped $Si_{1-x1-y}Ge_{x1}C_y$ crystal ranging from 0.01% to 0.10%.

4. The HBT device of claim 2, a Ge mole fraction, x2, of said Ge-rich, crystalline $Si_{1-x2}Ge_{x2}$ layer being greater than or equal to said Ge mole fraction, x1, of said B$^+$-doped $Si_{1-x1}Ge_{x1}$ crystal.

5. The HBT device of claim 1, further comprising a p-type extrinsic base layer disposed on said Ge-rich, crystalline $Si_{1-x2}Ge_{x2}$ layer, said p-type extrinsic base layer comprising one of: a highly B$^+$-doped crystalline Si layer and a highly B$^+$-doped crystalline $Si_{1-x3}Ge_{x3}$ layer, a Ge mole fraction, x3, of said highly B$^+$-doped crystalline $Si_{1-x3}Ge_{x3}$ layer ranging up to 40%.

6. The HBT device of claim 5, further comprising an insulating layer disposed on said p-type extrinsic base layer and not over said top surface of said p-type intrinsic base.

7. The HBT device of claim 5, further comprising:
an n-type emitter lead disposed on said n-type diffusion-doped crystalline emitter; and
insulating sidewalls that insulate said n-type diffusion-doped crystalline emitter and said emitter lead, which are disposed over said top surface of said p-type intrinsic base, from said Ge-rich crystalline $Si_{1-x2}Ge_{x2}$ layer, said p-type extrinsic base layer, and said insulating layer, which are disposed over said angled facets of said p-type intrinsic base.

8. The HBT device of claim 7, said n-type emitter lead, said n-type diffusion-doped crystalline emitter stack, and said n-type collector region comprising an n-type impurity of one of phosphorus (P) and arsenic (As).

9. A heterojunction bipolar transistor (HBT) device, comprising:
an n-type collector region disposed within a crystalline silicon (Si) layer that is bounded by shallow trench isolators (STIs);
a p-type intrinsic base comprising a boron-doped carbon-containing silicon germanium (B$^+$-doped $Si_{1-x1-y}Ge_{x1}C_y$) crystal that is disposed on a top surface of said crystalline Si layer and that forms angled facets on interfaces of said crystalline Si layer with said STIs;
a Ge-rich, crystalline $Si_{1-x2}Ge_{x2}$ layer disposed on said angled facets and not on a top surface of said B$^+$-doped $Si_{1-x1-y}Ge_{x1}C_y$ crystal; and
an n-type diffusion-doped Si crystalline emitter disposed on said top surface and not on said angled facets of said B$^+$-doped $Si_{1-x1-y}Ge_{x1}C_y$ crystal.

10. The HBT device of claim 9, a Ge mole fraction, x1, of said B$^+$-doped carbon-containing $Si_{1-x1-y}Ge_{x1}C_y$ crystal ranging from 10% to 40%, and a carbon mole fraction, y, of said B$^+$-doped carbon-containing $Si_{1-x1-y}Ge_{x1}C_y$ crystal ranging from 0.01% to 0.10%.

11. The HBT device of claim 9, said Ge-rich, crystalline $Si_{1-x2}Ge_{x2}$ layer further comprising carbon (C) to form a Ge-rich, crystalline $Si_{1-x2-y}Ge_{x2}C_y$ layer, a carbon mole fraction, y, of said Ge-rich, crystalline $Si_{1-x2-y}Ge_{x2}C_y$ layer ranging up to 0.10%.

12. The HBT device of claim 9, further comprising a p-type extrinsic base layer disposed on said Ge-rich, crystalline $Si_{1-x2}Ge_{x2}$ layer, said p-type extrinsic base layer comprising one of: a highly B$^+$-doped crystalline Si layer and a highly B$^+$-doped crystalline $Si_{1-x3}Ge_{x3}$ layer, a Ge mole fraction, x3, of said highly B$^+$-doped crystalline $Si_{1-x3}Ge_{x3}$ layer ranging up to 40%.

13. The HBT device of claim 12, further comprising an insulating layer disposed on said p-type extrinsic base layer and not over said top surface of said p-type intrinsic base.

14. The HBT device of claim 13 further comprising:
an n-type emitter lead disposed on said n-type diffusion-doped Si crystalline emitter; and
insulating sidewalls that insulate said n-type diffusion-doped Si crystalline emitter and said emitter lead, which are disposed over said top surface of said p-type intrinsic base, from said Ge-rich crystalline $Si_{1-x2}Ge_{x2}$ layer, said p-type extrinsic base layer, and said insulating layer, which are disposed over said angled facets of said p-type intrinsic base.

15. A method of making a heterojunction bipolar transistor (HBT) device, comprising:
forming an n-type collector region within a crystalline silicon (Si) layer that is bounded by shallow trench isolators (STIs);
epitaxially growing a p-type intrinsic base that comprises a boron-doped silicon germanium (B$^+$-doped $Si_{1-x1}Ge_{x1}$) crystal on a top surface of said crystalline Si layer, said B$^+$-doped $Si_{1-x1}Ge_{x1}$ crystal forming angled facets on interfaces of said crystalline Si layer with said STIs;
depositing a sacrificial layer on a top surface and not on said angled facets of said B$^+$-doped $Si_{1-x1}Ge_{x1}$ crystal;
epitaxially growing a Ge-rich crystalline $Si_{1-x2}Ge_{x2}$ layer on said sacrificial layer and on said angled facets of said B$^+$-doped $Si_{1-x1}Ge_{x1}$ crystal;
epitaxially growing a p-type extrinsic base layer comprising a highly B$^+$-doped crystalline Si layer on said Ge-rich crystalline $Si_{1-x2}Ge_{x2}$ layer;
etching an emitter opening through a central portion of at least said highly B$^+$-doped crystalline Si layer, said Ge-rich crystalline $Si_{1-x2}Ge_{x2}$ layer, and said sacrificial layer to said top surface of said B$^+$-doped $Si_{1-x1}Ge_{x1}$ crystal; and
forming an n-type diffusion-doped Si crystalline emitter on said top surface of said B$^+$-doped $Si_{1-x1}Ge_{x1}$ crystal in said emitter opening.

16. The method of claim 15 further comprising, forming an insulating layer on said highly B$^+$-doped crystalline Si layer, before etching said emitter opening.

17. The method of claim 16, said forming an n-type diffusion-doped Si crystalline emitter on said top surface of said B$^+$-doped $Si_{1-x1}Ge_{x1}$ crystal in said emitter opening further comprising:
forming insulating sidewalls on said emitter opening;
epitaxially growing a crystalline Si cap on said top surface of said B$^+$-doped $Si_{1-x1}Ge_{x1}$ crystal between said insulating sidewalls;
forming an n-type doped non-crystalline polysilicon on said crystalline Si cap between said insulating sidewalls; and
annealing said n-type doped non-crystalline polysilicon to form an n-type doped emitter lead, from which an n-type impurity diffuses into said crystalline Si cap to form said n-type diffusion-doped crystalline emitter of said HBT.

18. The method of claim 15, said epitaxially growing of said p-type intrinsic base further comprising adding a carbon-containing gas to an admixture of boron-containing, silicon-containing, and germanium-containing gases to epitaxially grow a B$^+$-doped Si$_{1-x1-y}$Ge$_{x1}$C$_y$ crystal.

19. A method of making a heterojunction bipolar transistor (HBT) device, comprising:
- forming an n-type collector region within a crystalline silicon (Si) layer that is bounded by shallow trench isolators (STIs);
- epitaxially growing a p-type intrinsic base that comprises a boron-doped silicon germanium (B$^+$-doped Si$_{1-x1}$Ge$_{x1}$) crystal on a top surface of said crystalline Si layer, said B$^+$-doped Si$_{1-x1}$Ge$_{x1}$ crystal forming angled facets that are disposed on interfaces of said crystalline Si layer with said STIs;
- depositing a sacrificial layer on a top surface and not on said angled facets of said B$^+$-doped Si$_{1-x1}$Ge$_{x1}$ crystal;
- epitaxially growing a Ge-rich crystalline Si$_{1-x2}$Ge$_{x2}$ layer on said sacrificial layer and on said angled facets of said B$^+$-doped Si$_{1-x1}$Ge$_{x1}$ crystal;
- epitaxially growing a p-type extrinsic base layer comprising a highly B$^+$-doped crystalline Si layer on said Ge-rich crystalline Si$_{1-x2}$Ge$_{x2}$ layer;
- forming an insulating layer on said highly B$^+$-doped crystalline Si layer;
- etching an emitter opening through a central portion of said insulating layer, said highly B$^+$-doped crystalline Si layer, said Ge-rich crystalline Si$_{1-x2}$Ge$_{x2}$ layer, and said sacrificial layer to said top surface of said B$^+$-doped Si$_{1-x1}$Ge$_{x1}$ crystal;
- epitaxially growing a crystalline Si cap on said top surface of said B$^+$-doped Si$_{1-x1}$Ge$_{x1}$ crystal;
- forming an n-type doped non-crystalline polysilicon on said crystalline Si cap; and
- annealing said n-type doped non-crystalline polysilicon to form an n-type doped crystalline emitter, from which an n-type impurity diffuses into said crystalline Si cap to form an n-type diffusion-doped Si crystalline emitter of said HBT.

20. The method of claim 19 further comprising forming insulating sidewalls on said emitter opening, before epitaxially growing said crystalline Si cap.

21. The method of claim 19, said epitaxially growing of said B$^+$-doped carbon-containing Si$_{1-x1-y}$Ge$_{x1}$C$_y$ crystal comprising an admixture of: one of silane (SiH$_4$) and disilane (Si$_2$H$_6$) gases, one of germane (GeH$_4$) and digermane (Ge$_2$H$_6$) gases, borane (B$_2$H$_6$) gas, and methylsilane (CH$_3$SiH$_3$) gas.

22. The method of claim 21, a Ge mole fraction, x1, of said B$^+$-doped carbon-containing Si$_{1-x1-y}$Ge$_{x1}$C$_y$ crystal ranging from 10% to 40%, and a carbon mole fraction, y, of said B$^+$-doped carbon-containing Si$_{1-x1-y}$Ge$_{x1}$C$_y$ crystal ranging from 0.01% to 0.10%.

23. The method of claim 19, said epitaxially growing of said Ge-rich, Si$_{1-x2}$Ge$_{x2}$ layer including an admixture of: one of silane (SiH$_4$) and disilane (Si$_2$H$_6$) gases, and one of germane (GeH$_4$) and digermane (Ge$_2$H$_6$) gases.

24. The method of claim 23, a Ge mole fraction, x2, of said Ge-rich, crystalline Si$_{1-x2}$Ge$_{x2}$ layer being greater than or equal to a Ge mole fraction, x1, of said B$^+$-doped carbon-containing Si$_{1-x1-y}$Ge$_{x1}$C$_y$ crystal of said p-type intrinsic base.

25. The method of claim 19, said epitaxially growing of said p-type extrinsic base layer further comprising adding one of germane (GeH$_4$) and digermane (Ge$_2$H$_6$) gases to an admixture of one of silane (SiH$_4$) and disilane (Si$_2$H$_6$) gases and borane gas, to form a highly B$^+$-doped crystalline Si$_{1-x3}$Ge$_{x3}$ layer, a Ge mole fraction, x3, of said highly B$^+$-doped crystalline Si$_{1-x3}$Ge$_{x3}$ layer ranging up to 40%.

* * * * *